(12) United States Patent
Ikehashi

(10) Patent No.: US 6,600,303 B2
(45) Date of Patent: Jul. 29, 2003

(54) CURRENT SOURCE CIRCUIT

(75) Inventor: Tamio Ikehashi, Kamakura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 112 days.

(21) Appl. No.: 09/963,682

(22) Filed: Sep. 27, 2001

(65) Prior Publication Data

US 2002/0042176 A1 Apr. 11, 2002

(30) Foreign Application Priority Data

Sep. 28, 2000 (JP) ........................................ 2000-296411

(51) Int. Cl.⁷ ................................................. G05F 3/16
(52) U.S. Cl. ........................................ 323/315; 323/312
(58) Field of Search ................................ 323/304, 311, 323/312, 315

(56) References Cited

U.S. PATENT DOCUMENTS 5,825,168 A * 10/1998 Kimber ........................ 323/315
5,920,185 A * 7/1999 Ozoe ............................ 323/315
6,031,414 A * 2/2000 Kitamura ..................... 327/538

FOREIGN PATENT DOCUMENTS

EP 0936627 8/1999

OTHER PUBLICATIONS

M. Gaibotti et al., "A Fast 1Mb EEPROM with 1.8V to 3.6V Operating Voltage", SGS Thomson R&D, Apr. 1998, pp. 2–8.

* cited by examiner

*Primary Examiner*—Adolf Deneke Berhane
*Assistant Examiner*—Gary L. Laxton
(74) *Attorney, Agent, or Firm*—Banner & Witcoff, Ltd.

(57) ABSTRACT

A current source circuit has a first current path through which a first current is supplied to a first circuit from a first current source via a first terminal, the first circuit having a first device with a specific voltage-current characteristics and a second current path through which a second current is supplied to a second circuit from a second current source having the same current-drive capability as the first current source via a second terminal, the second circuit having a second device with voltage-current characteristics different from that for the first device of the first circuit, characteristic curves in the both voltage-current characteristics being crossing each other at certain voltage and current values. The current source circuit also has a third circuit connected to the first terminal, that pulls out a current from the first terminal and a fourth circuit connected to the second terminal, that pulls out a current of the same amount as the current pulled out from the first terminal, from the second terminal. The third and the fourth circuits pull out excess current components from the first and the second terminals, respectively, so that the first and the second currents become equal to each other.

12 Claims, 4 Drawing Sheets

CURRENT SOURCE CIRCUIT

CROSS REFERENCE TO RELATED APPLICATIONS

This application claims benefit of priority under 35USC §119 to Japanese Patent Application No. 2000-296411 filed on Sep. 28, 2000 in Japan, the entire contents of which are incorporated by reference herein.

BACKGROUND OF THE INVENTION

The present invention relates to a current source circuit installed in a semiconductor device.

A current source circuit such as the one shown in FIG. 1 used as a current source for an operational amplifier has been known. The circuit shown in FIG. 1 is disclosed in "Analog Integrated Circuit Design for VLSI Designers" by P. R. Gray and R. G. Mayer, 1999, pp307 and pp308.

The current source circuit shown in FIG. 1 is set in a stable operation mode by turning on a start-up transistor QN15 to cause decrease in gate potential for PMOS transistors QP11, QP12 and QP13 that constitute a current mirror circuit.

The PMOS transistors QP11 and QP12 of the current mirror circuit, when their sizes are equal, provide the same amount of current to a current path from the PMOS transistor QP12 to an NMOS transistor QN12 and a resistor R11 and to another current path from the PMOS transistor QP11 to an NMOS transistor QN11 and a diode D11. That same amount of current is also flown to an NMOS transistor QN13 from the PMOS transistor QP13 when the transistors QP12 and QP13 have the same size.

The NMOS transistor QN13 and an NMOS transistor QN14 as a current source for an operational amplifier OP also constitute a current mirror circuit, thus providing a stable current source circuit for the operational amplifier OP.

In this known current source circuit, the minimum voltage VCCmin of a power supply voltage VCC for a stable operation is roughly expressed as below when looking at the current path from the PMOS transistor QP11 to the NMOS transistor QN11 and the diode D11.

$$VCCmin = |Vtp| + Vf + 0.3 \quad (1)$$

In this expression, Vtp is a threshold voltage of the PMOS transistor QP11, Vf is a voltage (about 0.6 V) between the anode and cathode of the diode D11 in forward bias and 0.3 V is a voltage between the drain and source of the NMOS transistor QN11.

The expression (1) teaches that the larger the absolute value of a threshold voltage of the PMOS transistor, the higher the minimum power supply voltage VCCmin for a stable operation of a current source circuit.

Power supply voltages have been lowered in accordance with advancement of transistor micro-fabrication for semiconductor memories, etc. In this tendency, however, the minimum voltage VCCmin for a stable operation of a current source circuit will not vary if a threshold voltage of a PMOS transistor is not varied as discussed above, thus obstructing further lowering of power supply voltage.

For example, Vtp=−1 V for a threshold voltage of a PMOS transistor gives about 1.9 V for the minimum voltage VCCmin for a stable operation of a current source circuit according to the expression (1). This means that a power supply voltage for a semiconductor memory cannot be lowered to 1.8 V or less. The minimum voltage VCCmin for a current source circuit can be lowered as an absolute value of a threshold voltage is lowered for each PMOS transistor to be installed in a semiconductor memory.

Decrease in threshold voltage for all PMOS transistors to be installed in a semiconductor memory, however, results in worse cut-off characteristics which will cause a large leak current for a semiconductor memory, thus being difficult for meeting requirements of current to be consumed.

Decrease in threshold voltage for PMOS transistors only for a current source circuit of a semiconductor memory can prevent a leak current from increase. Fabrication of PMOS transistors with different threshold voltages in a semiconductor memory will, however, increase the number of production processes, thus raising production cost.

Therefore, what is required here is a current source circuit that operates by a lower power supply voltage with no change in threshold voltage for PMOS transistors.

SUMMARY OF THE INVENTION

A purpose of the present invention is to provide a current source circuit that operates by a power supply voltage lower than that for known current source circuit.

The present invention provides a current source circuit comprising: a first current path through which a first current is supplied to a first circuit from a first current source via a first terminal, the first circuit having a first device with a specific voltage-current characteristics; a second current path through which a second current is supplied to a second circuit from a second current source having the same current-drive capability as the first current source via a second terminal, the second circuit having a second device with voltage-current characteristics different from that for the first device of the first circuit, characteristic curves in the both voltage-current characteristics being crossing each other at certain voltage and current values; a third circuit connected to the first terminal, that pulls out a current from the first terminal; and a fourth circuit connected to the second terminal, that pulls out a current of the same amount as the current pulled out from the first terminal, from the second terminal, the third and the fourth circuits pulling out excess current components from the first and the second terminals, respectively, so that the first and the second currents become equal to each other.

Moreover, the present invention provides a differential amplifier circuit comprising: a first current path through which a first current is supplied to a first circuit from a first current source via a first terminal; a second current path through which a second current is supplied to a second circuit from a second current source having current-drive capability the same as the first current source via a second terminal, the first and the second circuit being a pair of differential transistors, differential signals being supplied to the gates of the differential transistors; a third circuit connected to the first terminal, that pulls out a current from the first terminal; and a fourth circuit connected to the second terminal, that pulls out a current of the same amount as the current pulled out from the first terminal, from the second terminal, the third and the fourth circuits pulling out excess current currents from the first and the second terminals, respectively, so that the first and the second current become equal to each other.

DETAILED DESCRIPTION OF PREFERRED EMBODIMENTS

Several embodiments according to the present invention will be disclosed with reference to the attached drawings.

Figure 1:
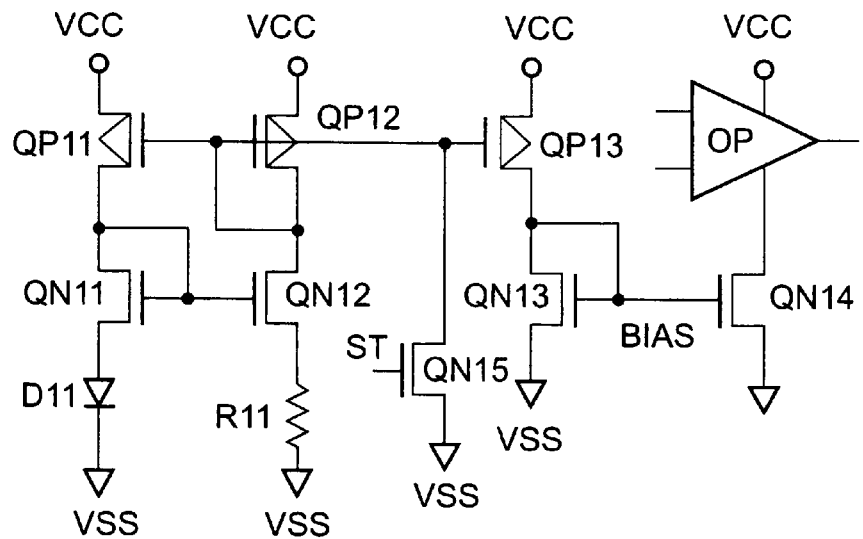
FIG. 1 shows a circuit diagram of a known current source circuit.
Figure 2:
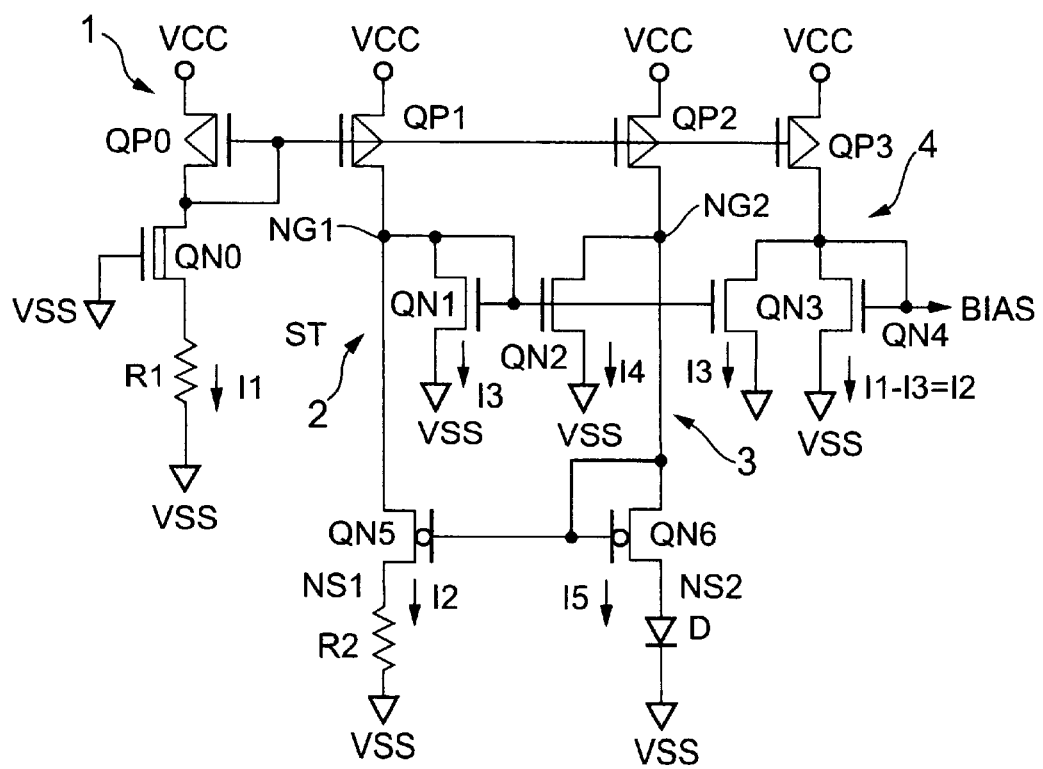
FIG. 2 shows a circuit diagram of an embodiment of a current source circuit according to the present invention.

FIG. 2 shows a block diagram of an embodiment of a current source circuit according to the present invention.

Provided in the main section of the current source circuit are two current paths 2 and 3 having PMOS transistors QP1 and QP2, respectively, as current-source transistors. The source of each of the transistors QP1 and QP2 is connected to a positive power-supply terminal VCC. The drains of these transistor are connected to terminals NG1 and NG2, respectively.

Connected in series between the terminal NG1 and a ground terminal VSS are intrinsic (I)-type NMOS transistor QN5 and a resistor R2. Connected in series between the terminal NG2 and another ground terminal VSS are I-type NMOS transistor QN6 and a diode D.

The gates of the NMOS transistors QN5 and QN6 are both connected to the drain of the transistor QN6 so that these transistors constitute a current mirror circuit. I-type transistors are used for the NMOS transistors QN5 and QN6 so that the current mirror circuit will properly operate even at no voltage drop for these transistors.

The current-source transistors QP1 and QP2 in the current paths 2 and 3, respectively, will have the same current-supply capability when they have the same size. A reference current-generating circuit 1 is provided for supplying a drive voltage to the gate of each of these transistors. The circuit 1 has a current-source PMOS transistor QP0, the source being connected to a terminal VCC, the gate and drain being connected each other. Between the drain of this transistor and a terminal VSS, a depletion (D)-type NMOS transistor QN0 and a resistor R1 are connected in series. The gate of the NMOS transistor QN0 is grounded.

The D-type NMOS transistor QN0 is used for saturating a current I1 flowing through the reference current-generating circuit 1 when a power supply voltage VCC is raised, as discussed later in detail. The resistor R1 is adjusted so that the current I1 will become larger than currents I2 and I5 flowing through the current paths 1 and 2, respectively, in a stable operation.

The PMOS transistor QP0 of the reference current-generating circuit 1 and the PMOS transistors QP1 and QP2 in the current paths 1 and 2, respectively, which are driven by a drain-gate voltage of the transistor QP0, constitute a current mirror circuit.

Therefore, the current of the same amount as the one flowing through the reference current-generating circuit 1 will flow through the current paths 2 and 3 when the PMOS transistors QP0, QP1 and QP2 have the same size.

As explained above, the current I1 for the reference current-generating circuit 1 is set as larger than the current I2=I5 (voltages at terminals NS1 and NS2 of the resistor R2 and the diode D, respectively, being equal to each other) which will flow when a stable current-source operation is conducted on the current paths 2 and 3.

A circuit of NMOS transistors QN1 and QN2 is provided for pulling out excess current components I3 and I4 from the current paths 2 and 3, respectively, that go beyond the currents I2 and I5 for a stable operation among the currents supplied to the terminals NG1 and NG2 from the current-supply PMOS transistors QP1 and QP2.

The NMOS transistors QN1 and QN2 are enhancement (E)-type NMOS transistors having the same size. The gate and drain of the transistors QN1 are both connected to the terminal NG1 and the source is connected to a terminal VSS. The gate, drain and source of the transistor QN2 are connected to the terminal NG1, the terminal NG2 and a terminal VSS, respectively. The transistors QN1 and QN2 constitute a current mirror circuit through these connections.

A bias circuit 4 is provided for obtaining a bias output BIAS to be supplied to an operational amplifier (not shown), etc., from this current source circuit. The circuit 4 has a current-source PMOS transistor QP3 that constitutes a current mirror circuit together with the PMOS transistor QP0, QP1 and QP2.

A diode-connected E-type NMOS transistor QN4 is provided between a terminal BIAS that is a drain terminal of the PMOS transistor QP3 and a terminal VSS. Also provided between the terminal BIAS and the terminal VSS is an NMOS transistor QN3 that constitutes a current mirror circuit together with the NMOS transistors QN1 and QN2.

The PMOS transistor QP3 has the same size as the PMOS transistor QP0, QP1 and QP2, and the NMOS transistor QN3 has the same size as the NMOS transistor QN1 and QN2 so that the current of the same amount as those flowing through the current paths 2 and 3 will flow through the bias circuit 4.

Therefore, in a stable operation, the current of the same amount as the current I2=I5 for the current paths 2 and 3 will flow through the NMOS transistor QN4 while an excess current supplied from the current-source PMOS transistor QP3 will be pulled out from the terminal BIAS through the NMOS transistor QN3.

Figure 3:
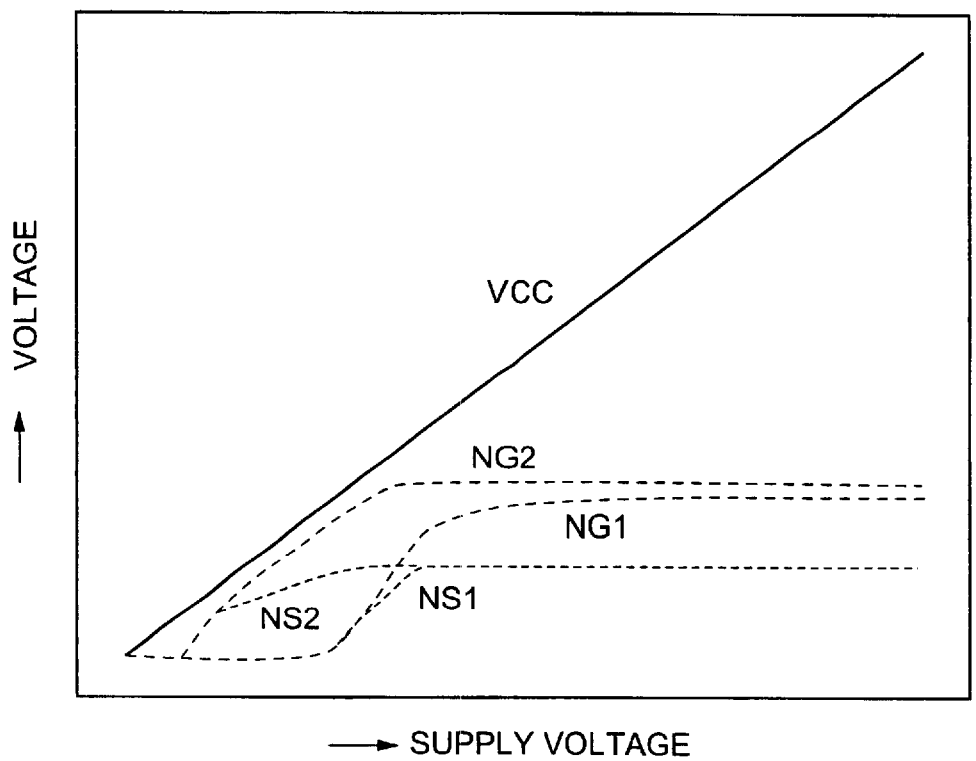
FIG. 3 shows graphs indicating power supply-dependent voltages for respective circuit sections of the current source circuit shown in FIG. 2.
Figure 4:
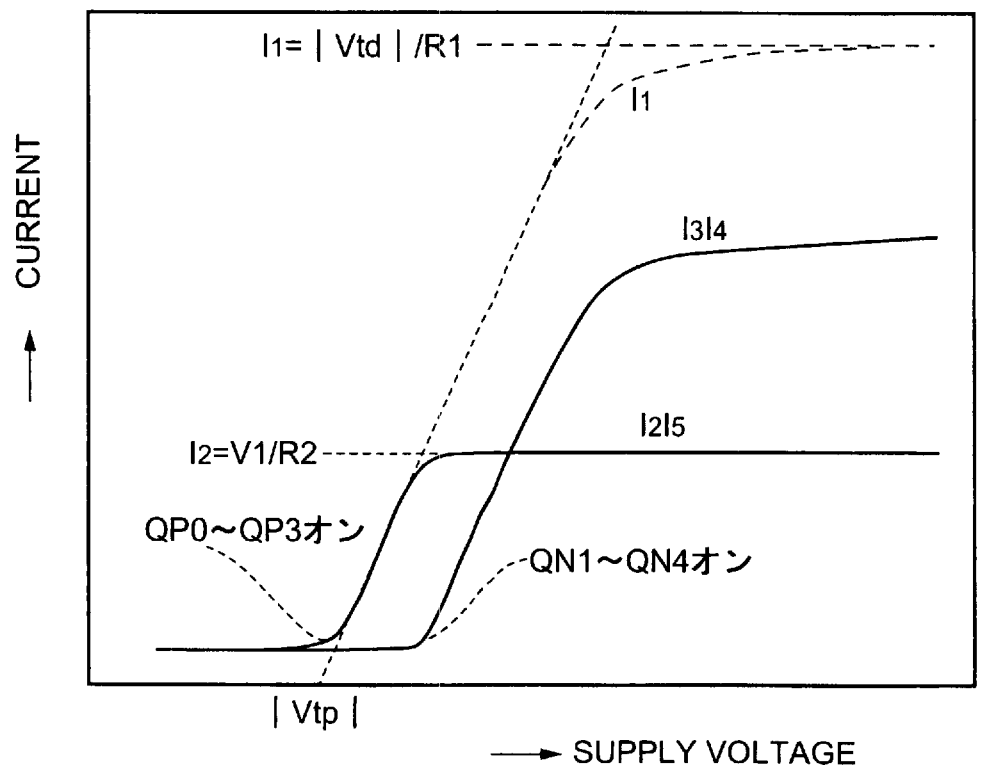
FIG. 4 shows graphs indicating power supply-dependent currents for respective circuit sections of the current source circuit shown in FIG. 2.

Discussed next with reference to FIGS. 3 and 4 is an operation, dependency on power supply voltage, of the current source circuit as constituted above.

As explained above, the resistor R1 is adjusted so that the current I1 larger than those for the current paths 2 and 3 in a stable operation will flow through the reference current-generating circuit 1. This current I1 is, however, not so accurate and will vary in accordance with the power supply voltage VCC.

FIG. 3 indicates voltage variation at respective terminals and FIG. 4 indicates current variation at respective sections while power supply voltage VCC is being raised from a low voltage.

The current source circuit in this embodiment will operate through the following steps when power is on.

(1) VCC<|Vtp|

While VCC is lower than the absolute value |Vtp| of a threshold voltage for the PMOS transistors QP0, QP1, QP2 and QP3, these transistors are off, so that 0 V appears at the terminal NS1 of the resistor R2 in the current path 2 whereas a voltage (obtained by voltage division by high resistance of the respective components decided according to a leak current) appears at the terminal NS2 of the diode D in the current path 3.

(2) |Vtp|<VCC<|Vtp|+(R1/R2)Vf

A current starts to flow through the respective components when VCC goes beyond the absolute value |Vtp| of the threshold voltage for the PMOS transistors QP0, QP1, QP2 and QP3. The current I1 for the reference current-generating circuit 1 is expressed as below when the resistance of the NMOS transistor QN0 is disregarded.

$$I1 = (VCC - |Vtp|)/R1 \quad (2)$$

The current mirror operation provides the same amount of current to the current paths 2 and 3, that is, I1=I2=I5. The maximum value of the current I1 is decided by the NMOS transistor QN0 of the reference current-generating circuit 1. In detail, the maximum value of the current I1 is decided as (VCC−|Vtd|)/R1 at which the transistor QN0 turns off due to negative feed-back through the resistor R1 where Vtd is a negative threshold voltage of the transistor QN0.

The NMOS transistors QN1, QN2 and QN3 are off (I3=I4=0) until the VCC reaches a threshold voltage Vtn of the transistor QN1. A voltage at the terminal NS1 will be linearly raised with increase in the current I2, the same for the terminal NG1. On the contrary, a voltage at the terminal NS2 will be exponentially raised with gradual increase at the beginning in accordance with the voltage-current characteristics of the diode D.

(3) |Vtp|+(R1/R2)Vf<VCC

A further increase in VCC causes increase in the current I1 for the reference current-generating circuit 1. The PMOS transistors QP1 and QP2 also try to supply further currents to the current paths 2 and 3, respectively. The voltage increase at the terminal NS1 will, however, be stopped when the NMOS transistor QN5 is turned off. In detail, the current mirror circuit of the NMOS transistors QN5 and QN6 operates to keep I2=I5 and provides I2×R2=Vf (a forward transient build-up voltage of the diode D).

The relationship I1=I2=I5 gives the following expression until the NMOS transistors QN1, QN2 and QN3 turn on.

$$I2 \times R2 = Vf \quad (3)$$

A still further increase in VCC according to VCC=|Vtp|+(R1/R2)Vf obtained from the expressions (2) and (3) causes increase in voltages at the terminals NG1 and NG2 to turn on the NMOS transistors QN1 and QN2 where I3=I4 because of a current-mirror operation of these transistors.

Therefore, increase in VCC beyond a voltage required for keeping the current I2=I5 in the current paths 2 and 3 initiates pulling out of excess current components among the currents supplied by the PMOS transistors QP1 and QP2 through the NMOS transistors QN1 and QN2 to establish the relationship I1=I2+I3=I5+I4. Thereafter, the constant current I2=I5 flows through the current paths 2 and 3 even if VCC varies whereas the current I3=I4 varies as VCC varies. In other words, a constant current will flow through the resistor R2 and the diode D as independent of VCC.

As explained above, the NMOS transistors QN1 and QN2 turn on to pull out excess current components from the current paths 2 and 3, respectively, to keep the constant current I2=I3 for a stable operation.

The minimum value VCCmin for the power supply voltage VCC required for the stable operation is expressed as $$VCCmin = |Vtp| + (R1/R2)Vf + \Delta V \quad (4)$$

where ΔV (here, ΔV is 0.3 V) is obtained by adding a transient build-up voltage (between the drain and source) of the NMOS transistor QN1 and a difference between the threshold voltage and the gate-source voltage of each of the PMOS transistors PQ0, PQ1 and PQ2.

In this stable operation, the current I3 the same amount as that for the NMOS transistor QN1 will flow through the NMOS transistor QN3 of the bias circuit 4. This results in I1−I3=I2 flowing through the output stage NMOS transistor QN4 of the bias circuit 4, the current having same amount as the current for the current paths 2 and 3.

As disclosed above, the minimum value VCCmin of the power supply voltage VCC required for a stable operation of the current source circuit in this embodiment is obtained as the expression (4). It is apparent from the expression (4) that VCCmin can be lowered by adjusting smaller the resistance ratio (R1/R2), compared to the expression (1) for the known circuit even if the threshold voltage for the PMOS transistors are the same between the embodiment and the known circuit.

The minimum value VCCmin of the power supply voltage VCC can be lowered in this embodiment because the voltages appearing at the terminals NG1 and NG2 in the current paths 2 and 3, respectively, can be raised almost to the power supply voltage VCC in accordance with the properties of the PMOS transistors QP1 and QP2.

In detail, the PMOS transistors QP1 and QP2 supply currents for more than needs when the reference-current generating circuit 1 supplies a current equal to or larger than the current I2=I5 required for the current paths 2 and 3. The excess current components will, however, be pulled out through the NMOS transistors QN1 and QN2.

In other words, current supply equal to or larger than the current I2=I5 required for the current source circuit to the PMOS transistors QP1 and QP2 can raise the voltages at the terminals NG1 and NG2 almost to VCC (almost 0 V between the drain and source for the transistors QP1 and QP2). This current supply achieves a correct circuit operation even at a low power supply voltage VCC.

The embodiment shown in FIG. 2 uses the resistor R2 and the diode D as circuit components for obtaining a constant current through the current paths 2 and 3.

Not only those circuit components, a variety of combinations of circuit components can be used as long as they have different voltage-current characteristics where characteristic curves cross each other at certain voltage and current values.

Figure 5A:
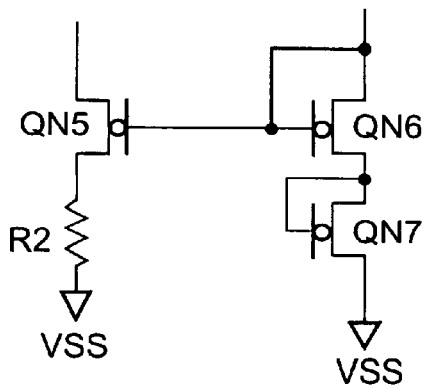
FIG. 5A shows a circuit diagram of a combination of a diode-connected MOS transistor and a resistor for a modification to circuit elements for obtaining a constant current through current paths 2 and 3 in the current source circuit shown in FIG. 2.
Figure 6A:
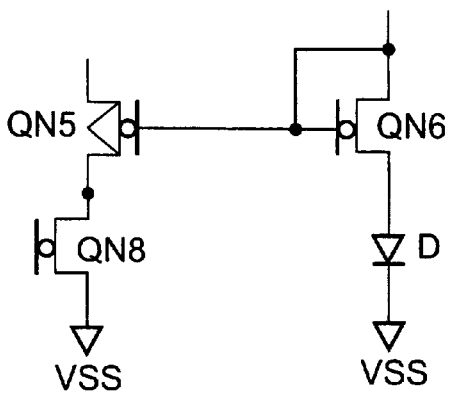
FIG. 6A shows a circuit diagram of a combination of a diode-connected MOS transistor and a p-n junction diode for another modification to circuit elements for obtaining a constant current through current paths 2 and 3 in the current source circuit shown in FIG. 2.

For example, a combination of a diode-connected MOS transistor QN7 and the resistor R2 shown in FIG. 5A or another combination of a diode-connected MOS transistor QN8 and the p-n junction diode D shown in FIG. 6A are useful as such circuit components.

Figure 5B:
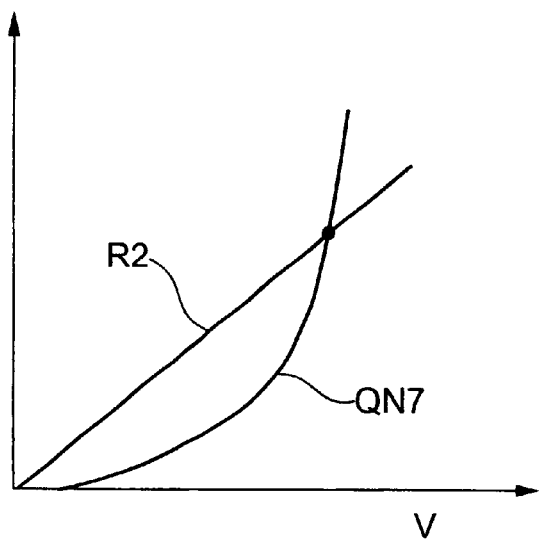
FIG. 5B shows graphs indicating voltage-current characteristics of the MOS transistor and the resistor shown in FIG. 5A.
Figure 6B:
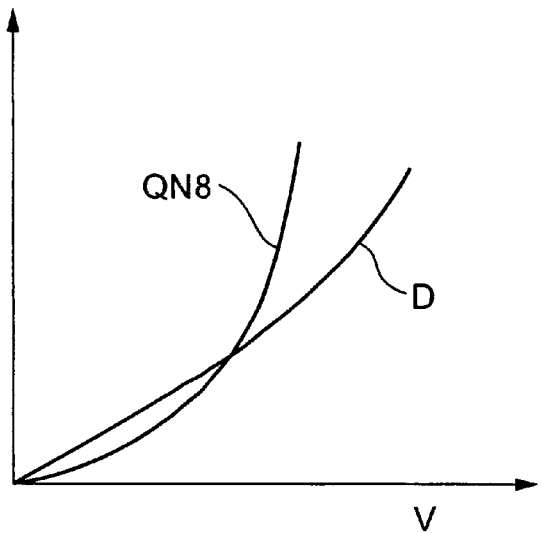
FIG. 6B shows graphs indicating voltage-current characteristics of the MOS transistor and the diode shown in FIG. 6A.

FIGS. 5B and 6B show voltage-current characteristics for the combinations of FIGS. 5A and 6A, respectively. Any combination of circuit components can be used as long as they have different voltage-current characteristics where characteristic curves cross each other at certain voltage and current values such as shown in FIGS. 5B and 6B.

An article "A First 1 MB EEPROM with 1.8 V to 3.6 V Operating Voltage" by M. Gaibotti, et al., in Non-Volatile Semiconductor Memory Workshop, 1998, pp46 to pp52, FIG. 7 discloses a current mirror circuit similar to the embodiment shown in FIG. 2.

This article, however, does not discuss lowering of power supply voltage for a current source circuit. Moreover, the current mirror circuit is complex than the embodiment shown in FIG. 2.

The embodiment shown in FIG. 2 uses the reference-current generating circuit 1 of relatively not so accurate due to dependency on power supply voltage. The total amount of current to be consumed by the current source circuit is 4×I1 depending on the current I1 that is not so accurate. This makes difficult for estimating the total power consumption of a device such as a semiconductor memory for which this current source circuit is installed.

Figure 7:
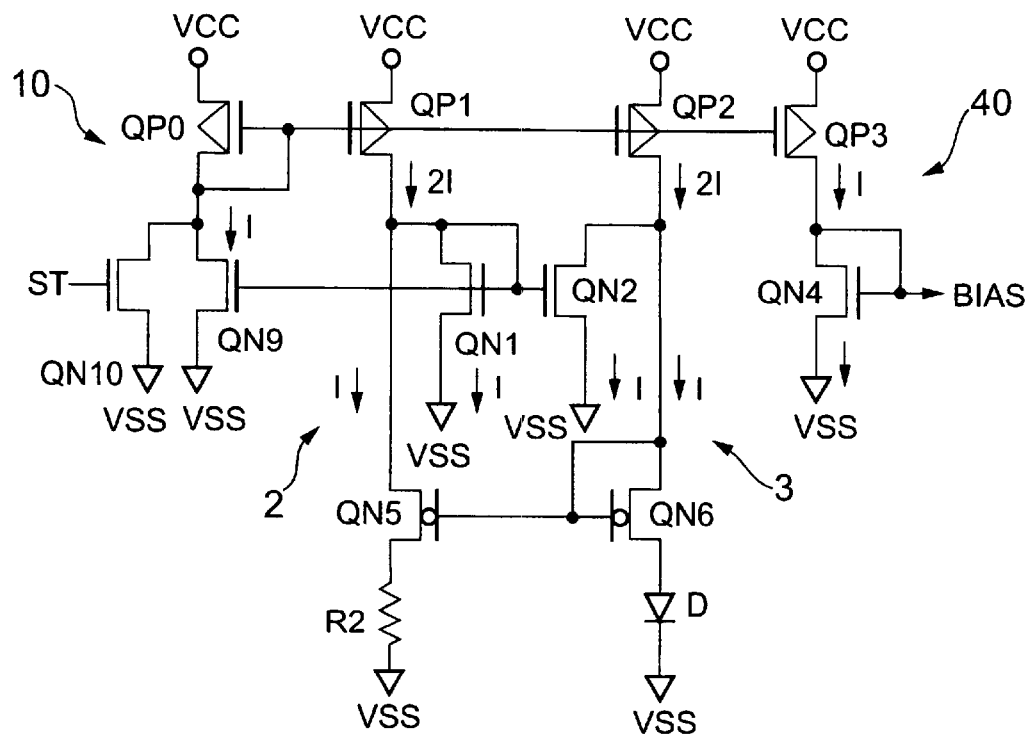
FIG. 7 shows a circuit diagram of another embodiment of a current source circuit according to the present invention.

FIG. 7 shows another embodiment of a current source circuit that will solve such a problem.

Elements in this embodiment that are the same as or analogous to elements shown in FIG. 2 are referenced by the same reference numbers and will not be explained in detail.

In this embodiment, the PMOS transistors QP1 and QP2 in the current paths 2 and 3, respectively, have the current drive capability (a ratio of channel width to channel length) two times that of the current-source PMOS transistor QP1 of a reference-current generating circuit 10, the transistors QP1, QP2 and QP3 constituting a current mirror circuit. The PMOS transistor QP3 of a bias circuit 40 has the same size as the PMOS transistor QP1.

An E-type NMOS transistor QN9 is connected between the drain of the PMOS transistor QP1 and the terminal VSS. The gate of the NMOS transistor QN9 is connected to the gates of the NMOS transistors QN1 and QN2 to constitute a current mirror circuit with the transistor QN1. The NMOS transistor QN9 has the same size as the NMOS transistors QN1 and QN2. In detail, the NMOS transistors QN2 and QN8 are fabricated as having the same size as the NMOS transistor QN1.

Furthermore, in this embodiment, an NMOS transistor QN10 (a start-up circuit) is provided as parallel to the NMOS transistor QN9. The NMOS transistor QN10 is turned on by an ST signal after power on so that the gate of the PMOS transistor QP0 is dropped to a low level, thus the transistor QP0 being turned on for an operation mode.

In a stable operation, a current I will flow through the reference-current generating circuit 10 via the PMOS transistor QP0 whereas a current 2I (two times of the current I) will flow through each of the current paths 2 and 3 via the PMOS transistors QP1 and QP2, respectively.

The excess current components I will be pulled out from the current paths 2 and 3 through the NMOS transistors QN1 and QN2, respectively, like the former embodiment.

The current I of the same amount as the current to the current paths 2 and 3 will flow through the NMOS transistor QN9 that constitutes a current mirror circuit with the NMOS transistor QN1, and also through the bias circuit 40.

Accordingly, current mirror operations by means of the PMOS transistors QP0 and QP1 and the NMOS transistors QN1 and QN9 provide the current I to the resistor R2 and the NMOS transistor QN1 in the current path 2 and also to the diode D and the NMOS transistor QN2 in the current path 3, the current I having the same amount as the current I of the reference-current generating circuit 10.

In other words, compared to the former embodiment that is dependent on power supply voltage, in this embodiment, the total amount of current 6I (2I×2+I+I) to be consumed by the current source circuit is decided by the characteristics of the circuit components without depending on power supply voltage. Thus, estimation of the total power consumption when the current source circuit is installed in a semiconductor memory, etc., is easy to make in this embodiment.

The present invention is not limited to the above embodiments. For example, the PMOS current mirror circuit (a current source) is provided in the high-level power terminal side for the above embodiments. The present invention, however, can be applied to circuitry in which an NMOS current mirror circuit (a current source) is provided in the low-level power terminal side. Such circuitry can be formed (not shown) such that, in FIG. 2, the terminals VCC are provided as negative-power supply power terminals with all the MOS transistors in reverse conductive-type and the diode D connected in a reverse direction.

Figure 8:
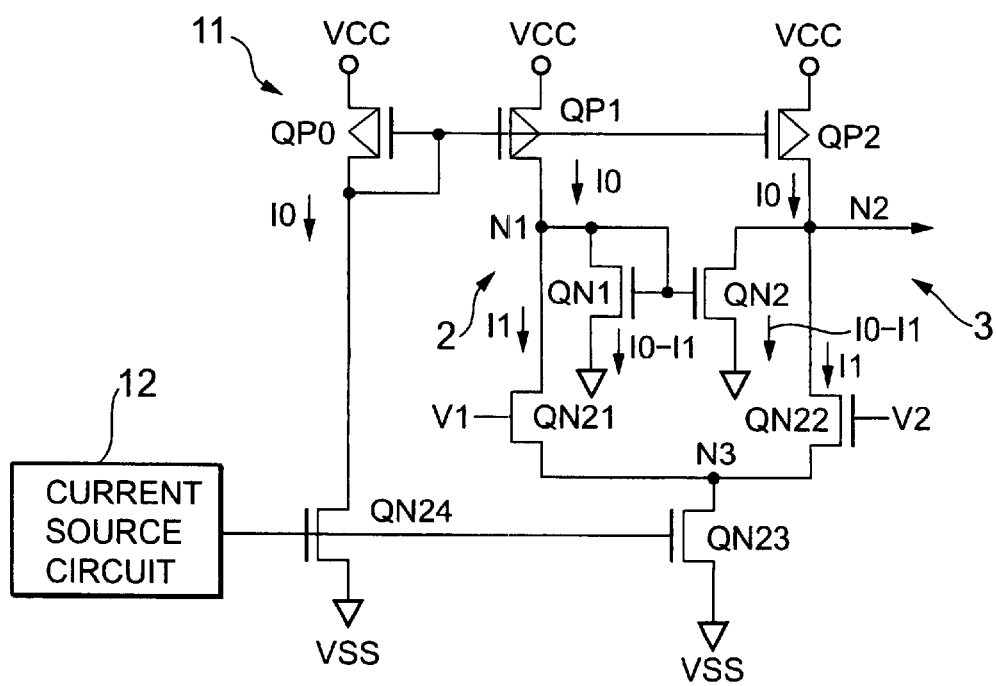
FIG. 8 shows a circuit diagram of an embodiment of a differential amplifier for which the present invention is applied.

A current source circuit according to the present invention is also applicable to a differential amplifier such as shown in FIG. 8.

Elements in FIG. 8 that are the same as or analogous to elements shown in FIGS. 2 or 7 are referenced by the same reference numbers and will not be explained in detail.

As shown in FIG. 8, NMOS transistors QN21 and QN22 of the same size that constitute a differential amplifier are provided in the current paths 2 and 3 having the PMOS transistors QP1 and QP2, respectively.

The sources of the NMOS transistors QN21 and QN22 are connected to a node N3 that is connected to a current-source NMOS transistor QN23. Differential inputs V1 and V2 are supplied to the gates of the NMOS transistors QN21 and QN22, respectively.

The current-source PMOS transistor QP0 of a reference current-generating circuit 11 is connected to a current-source NMOS transistor QN24 that is driven by another current source circuit 12 simultaneously with the current-source NMOS transistor QN23 of the differential amplifier.

Like the former embodiments, connected to terminals N1 and N2 in the current paths 2 and 3 are the NMOS transistors QN1 and QN2 for pulling out excess current components from the current paths.

In detail, among a current I0 supplied to each of the current paths 2 and 3 via the PMOS transistors QP0, QP1 and QP2 that constitute a current mirror circuit, a current component I0–I1 is flown to each of the NMOS transistors QN1 and QN2, so that a current I1 will be flown to each of the differential NMOS transistors QN21 and QN22. Therefore, a current level for the current-source transistor NMOS transistor QN 23 becomes lower than that for the current-source PMOS transistors QP1 and QP2.

In a known differential amplifier, all the currents supplied by current-source PMOS transistors are flown to differential NMOS transistors, so that a differential output voltage is raised to at most VCC–|Vtp|.

Compared to such known amplifier, in this differential amplifier according to the present invention, a current larger than that required for the differential circuit is flown via each of the current-source PMOS transistors QP1 and QP2, so that the voltages at the terminals N1 and N2 can be raised almost to VCC. In other words, the differential amplifier according to the present invention can provide an operating voltage like the known amplifier even at a low power supply voltage VCC.

As apparent from the differential amplifier shown in FIG. 8, a current source circuit of the present invention is applicable to several types of circuitry having current mirror circuits.

As disclosed above, the present invention provides a current source circuit that is operable at power supply voltage lower than known current source circuitry.

What is claimed is:

1. A current source circuit comprising:
   a first current path through which a first current is supplied to a first circuit from a first current source via a first terminal, said first circuit having a first device with a specific voltage-current characteristics;
   a second current path through which a second current is supplied to a second circuit from a second current source having the same current-drive capability as said first current source via a second terminal, said second circuit having a second device with voltage-current characteristics different from that for said first device of said first circuit, characteristic curves in the both voltage-current characteristics being crossing each other at certain voltage and current values;
   a third circuit connected to said first terminal, that pulls out a current from said first terminal; and
   a fourth circuit connected to said second terminal, that pulls out a current of the same amount as the current pulled out from said first terminal, from said second terminal, said third and said fourth circuits pulling out excess current components from said first and said second terminals, respectively, so that said first and said second currents become equal to each other.

2. The current source circuit according to claim 1, further comprising a reference-current generating circuit,
   wherein said first current source having a first MOS transistor, a source of which is connected to a first power supply terminal, a gate of which is supplied a gate voltage from said reference-current generating circuit, and a drain of which is connected to said first terminal, and
   said second current source having a second MOS transistor, a source of which is connected to said first power supply terminal, a gate of which is supplied a gate voltage from said reference-current generating circuit, and a drain of which is connected to said second terminal, said first and said second MOS transistors having the same size.

3. The current source circuit according to claim 2, wherein
   said third circuit has a third MOS transistor, a gate and drain of which are connected to said first terminal, a source of which is connected to a second power supply terminal, and
   said fourth circuit has a fourth MOS transistor, a drain of which is connected to said second terminal, a gate of which is connected to said gate of said third MOS transistor, and a source of which is connected to said second power supply terminal, said third and said fourth MOS transistors having the same size.

4. The current source circuit according to claim 3, wherein said first terminal is a high-level side power supply terminal and said second terminal is a low level-side power supply terminal, said first and said second MOS transistors are PMOS transistors, and said third and said fourth MOS transistors are NMOS transistors.

5. The current source circuit according to claim 3, wherein
   said first terminal is a high-level side power supply terminal and said second terminal is a low level-side power supply terminal,
   said reference-current generating circuit has a current-source PMOS transistor, a source of which is connected to the first power supply terminal, a gate and a drain of which are connected to each other and said series circuit of a depletion-type NMOS transistor and a resistor, the series circuit being provided between said drain of the current-source PMOS transistor and said second power supply terminal,
   said first and said second MOS transistors are PMOS transistors, said gates of which are connected to said gate of said current-source PMOS transistor, said PMOS transistors and said current-source PMOS transistor constituting a first current mirror circuit, and
   said third and said fourth MOS transistors are NMOS transistors that constitute a second current mirror circuit.

6. The current source circuit according to claim 3, wherein
   said first terminal is a high-level side power supply terminal and said second terminal is a low level-side power supply terminal,
   said reference-current generating circuit has a current-source PMOS transistor, a source of which is connected to said first power supply terminal, a gate and a drain of which are connected to each other and a fifth MOS transistor provided between said drain of the current-source PMOS transistor and said second power supply terminal,
   said first and said second MOS transistors are PMOS transistors, said gates of which are connected to said gate of said current-source PMOS transistor, said PMOS transistors and said current-source PMOS transistor constituting a first current mirror circuit, and
   said third, said fourth and said fifth MOS transistors are NMOS transistors, said fourth and said fifth MOS transistors having the same size as said third MOS transistor, and said third, said fourth and said fifth MOS transistors constituting a second current mirror circuit based on said third MOS transistor.

7. The current source circuit according to claim 6, wherein said first and said second MOS transistors are PMOS transistors having current-drive capability two times that of said current-source PMOS transistor.

8. The current source circuit according to claim 5, wherein said current-source PMOS transistor and said PMOS transistor that constitute said first current mirror circuit have the same size.

9. The current source circuit according to claim 8, wherein said first and second devices of said first and said second circuits are connected to said first and said second terminals, respectively, via MOS transistors that constitute a third current mirror circuit, one of said first and second devices being a resistor, the other being a diode.

10. The current source circuit according to claim 9, wherein the minimum value VCCmin of a power supply voltage to be supplied to said reference current-generating circuit so that said first and said second currents become equal to each other is obtained as VCCmin=|Vtp|+Vf(R1/R2)+ΔV where |Vtp| is the absolute value of a threshold voltage for said PMOS transistor that constitutes said first current mirror with said current-source PMOS transistor, Vf is a transient build-up voltage in a forward direction for said diode, R1 is resistance of said resistor of said reference current-generating circuit, R2 is resistance of said resistor that is included in either said first or said second circuit and ΔV is obtained by adding a transient build-up voltage of the third NMOS transistor and a difference between a threshold voltage and a gate-source voltage of said current-source PMOS transistor.

11. The current source circuit according to claim 1, wherein said first and second devices of said first and said second circuit are connected to said first and said second terminals, respectively, via MOS transistors that constitute a first current mirror circuit, one of said first and second devices being a diode, the other being a diode-connected MOS transistor.

12. A differential amplifier circuit comprising:
- a first current path through which a first current is supplied to a first circuit from a first current source via a first terminal;
- a second current path through which a second current is supplied to a second circuit from a second current source having the same current-drive capability the same as said first current source via a second terminal, said first and said second circuit being a pair of differential transistors, differential signals being supplied to gates of the differential transistors;
- a third circuit connected to said first terminal, that pulls out a current from said first terminal; and
- a fourth circuit connected to said second terminal, that pulls out a current of the same amount as said current pulled out from said first terminal, from said second terminal, said third and said fourth circuits pulling out excess current currents from said first and said second terminals, respectively, so that said first and said second current become equal to each other.

* * * * *

UNITED STATES PATENT AND TRADEMARK OFFICE
CERTIFICATE OF CORRECTION

PATENT NO. : 6,600,303 B1
DATED : July 29, 2003
INVENTOR(S) : Tamio Ikehashi

It is certified that error appears in the above-identified patent and that said Letters Patent is hereby corrected as shown below:

<u>Title page,</u>
Item [73], Assignee "Kawasaki" has been replaced with -- Tokyo --.

Signed and Sealed this

Seventeenth Day of February, 2004

JON W. DUDAS
*Acting Director of the United States Patent and Trademark Office*